United States Patent [19]
Satou et al.

[11] Patent Number: 6,066,551
[45] Date of Patent: May 23, 2000

[54] METHOD FOR FORMING BUMP OF SEMICONDUCTOR DEVICE

[75] Inventors: Tetsuo Satou; Yoshihiro Ishida, both of Tanashi, Japan

[73] Assignee: Citizen Watch Co., Ltd., Tokyo, Japan

[21] Appl. No.: 08/860,857

[22] PCT Filed: Oct. 3, 1996

[86] PCT No.: PCT/JP96/02871

§ 371 Date: Jul. 14, 1997

§ 102(e) Date: Jul. 14, 1997

[87] PCT Pub. No.: WO97/18584

PCT Pub. Date: May 22, 1997

[30] Foreign Application Priority Data

Nov. 15, 1995 [JP] Japan ..................................... 7-296880
Mar. 5, 1996 [JP] Japan ..................................... 8-047767

[51] Int. Cl.[7] .................................................. H01L 21/445
[52] U.S. Cl. .......................... 438/613; 438/614; 438/615
[58] Field of Search ..................................... 438/613, 614, 438/615

[56] References Cited

FOREIGN PATENT DOCUMENTS

| | | |
|---|---|---|
| 60-116157 | 6/1985 | Japan . |
| 3-12933 | 1/1991 | Japan . |
| 3-145732 | 6/1991 | Japan . |
| 3-95636 | 9/1991 | Japan . |
| 4-258131 | 9/1992 | Japan . |
| 5-36754 | 2/1993 | Japan . |
| 5-136146 | 6/1993 | Japan . |
| 5-191019 | 7/1993 | Japan . |
| 7-288255 | 10/1995 | Japan . |
| 8-139097 | 5/1996 | Japan . |

*Primary Examiner*—Caridad Everhart
*Attorney, Agent, or Firm*—Kanesaka & Takeuchi

[57] ABSTRACT

A method for forming a bump of a semiconductor device including an adhesive applying step of applying an adhesive to a pad electrode of a semiconductor device, a solder grain attaching step of attaching one or more solder grains to the portion of the pad electrode where the adhesive is applied, and a solder melting step of forming a bump by melting the solder grains. In the solder melting step, a metallic core is put in the bump. Therefore, a semiconductor device where a highly reliable bump is formed is obtained through simple steps.

20 Claims, 12 Drawing Sheets

METHOD FOR FORMING BUMP OF SEMICONDUCTOR DEVICE

BACKGROUND OF INVENTION

1. Technological Field

This invention relates to a method for forming a bump on pad electrodes of a flip-chip type semiconductor device.

2. Background Technology

On semiconductor devices that are bonded by means of the flip-chip method, solder bumps are formed on the pad electrodes. Conventional methods to form such solder bumps include metal evaporation, electrolytic plating, and/or stud-bumping. However, each of the first or third method has its own disadvantages: metal evaporation is inferior in precision in terms of recent larger wafer sizes, finer bump pitches and more complicated and dense bump shapes; and stud-bumping is expensive for mass-production so it is only used for experimental products. Therefore, electrolytic plating is becoming the major method for bump formation aimed at volume production.

FIG. 17 shows a conventional bump formed by electrolytic plating.

In the figure, 1 is a wafer; 2 a pad electrode made of aluminum; 3 a passivation film; 100 an electrolytic plating bump; 101 an undercoat metallic film; 102 a copper core; and 103 a solder bump.

In order to form this bump, the undercoat metallic film 101 is formed by evaporating aluminum, chrome, and copper onto the wafer 1 using a vacuum metal evaporation method, in order to ascertain the reliability of the pad electrode of the semiconductor device and the electrolytic connectivity. Then, plating resist is applied, and an appropriate part of the plating resist is opened to expose the undercoat metallic film 101 on the pad electrode 2. Copper is electrolytically plated using the undercoat metallic film 101 as the common electrode to form the copper core 102. Solder is also electrolytically plated. Next, the plating resist is removed, leaving the undercoat metallic film 101 in the bump portion, and the other portion of the undercoat metallic film is etched. Finally, after applying a flux, the solder is melted in a reflow furnace under a nitrogen atmosphere to complete the plating bump 100.

However, this method for forming solder bumps also has problems as follows.

First, it incurs high cost and is inflexible. Since equipment used in steps for forming photoresist and/or undercoat metallic film is expensive and the wafer sizes that can be handled are limited, it takes time for switching when the wafer size is changed, or sizes out of specification can not be handled. Thus, this method leads to high costs, and it is impossible to form bumps on chips rather than on wafers.

The second problem is reliability. When solder bumps are bonded to the substrate, it is necessary to plate a copper core, which is approximately 20 μm in thickness, in order to prevent solder bumps from being crushed and causing a short with the side of the semiconductor device. Copper is a hard material and adheres strongly to the undercoat metallic film. Hence, as chip sizes become larger, there are reliability problems such as discontinuity caused by peeling of the surface, cracked silicon, and so on, which are caused by stress under the copper core due to the different coefficients of linear expansion of copper and silicon substrate when thermal variations occur due to heating or cooling.

Third, etching of the undercoat metallic film is a difficult step. When aluminum, chrome, or copper is used as the undercoat metal, for example, it has been difficult to etch the undercoat metallic film without etching lead and tin. Also, it is difficult to control the amount and time of etching.

Meanwhile, a technique, in which solder is applied to leads of electronic parts or exposed patterns on a printed circuit board, has been suggested (see Japanese Patent Application Laid-Open No.074459/1995).

A similar technology, applying this technique, has not be developed to form bumps on pad electrodes on semiconductor devices. Furthermore, no information has been disclosed regarding a method to prevent bumps from being crushed while the bumps are bonded onto the substrate when forming a bump by means of this technique.

The objective of this invention is therefore to provide a method to form bumps on semiconductor devices in order to manufacture reliable products with simple steps, considering the above issues and situations.

DISCLOSURE OF INVENTION

In order to attain the above-mentioned objective, the present invention includes: a plating step to perform non-electrolytic plating on pad electrodes of semiconductor devices; an adhesive applying step to apply adhesive to non-electrolytic plated portions; a solder grain attaching step in which one or more solder grains is caused to adhere to the portion where adhesive has been applied; and a solder melting step in which solder grains are melted to form bumps.

In the step in which solder grains are melted to form bumps, metallic cores are placed within the bumps. At least one metallic core for each solder bump is used for a part of or all of the solder grains so that metallic cores are present in bumps during the solder melting step.

Also, this invention can be applied in a manner such that the above-mentioned metallic cores are mixed with solder grains and caused to adhere to portions where adhesive has been applied. Moreover, the above-mentioned metallic cores can be placed in bumps during the solder melting step by applying the metallic cores to the electrode portion in the steps for adhesive application and metallic core attachment independent of the solder grain attaching step.

In addition, the adhesive application, solder grain attachment, and solder melting steps in this invention consist of a high temperature solder adhesive applying step, high temperature solder grain attachment, and high temperature solder melting steps as well as low temperature solder adhesive application, low temperature solder grain attachment, and low temperature solder melting steps.

In this case, it is desired to perform the three high temperature steps first and then perform the three low temperature steps. This ensures that the high temperature solder functions as a metallic core.

In this way, the present invention provides highly reliable semiconductor devices using simple steps without expensive equipment. It can also deal easily with changes in wafer sizes.

Furthermore, selective non-electrolytic plating on aluminum allows simplification of the manufacturing process and reduction of costs since formation of a common electrode on a wafer, which is used in electrolytic plating, is not necessary.

BRIEF DESCRIPTIONS OF THE DRAWINGS

FIG. 1 shows a step flow diagram of a 1st embodiment of the method for forming a bump of a semiconductor device in the present invention.

FIG. 2 (a) to FIG. 2(f) show cross sections of the electrodes in the major steps in the 1st embodiment.

FIG. 3 shows a cross section of a bump formed in the 2nd embodiment of the method for forming a bump of a semiconductor device in the present invention.

FIG. 4 (a) and FIG. 4(b) show cross sections of the electrode in the major steps in a 3rd embodiment of the method for forming a bump of a semiconductor device in the present invention.

Figure 8A:
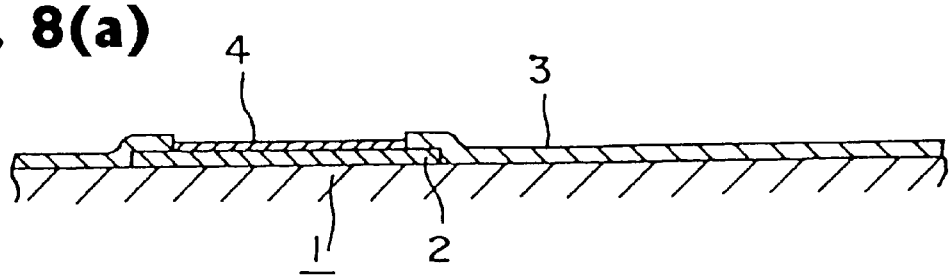
Figure 8B:
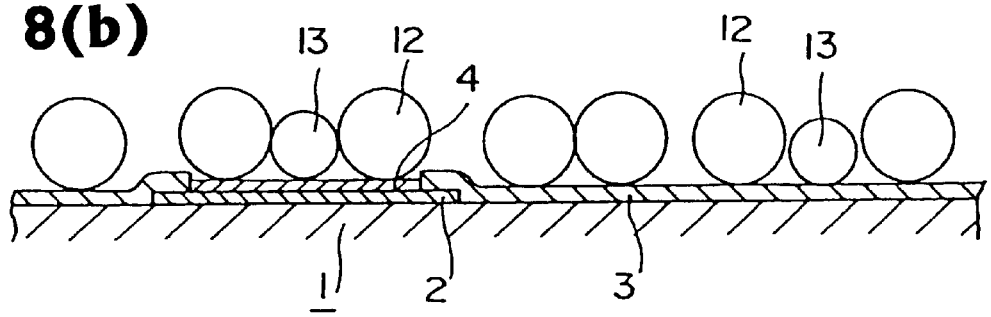
Figure 8C:
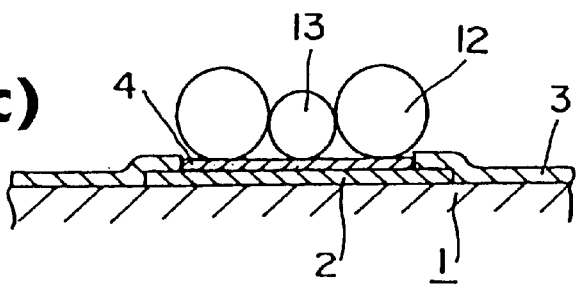
Figure 8D:
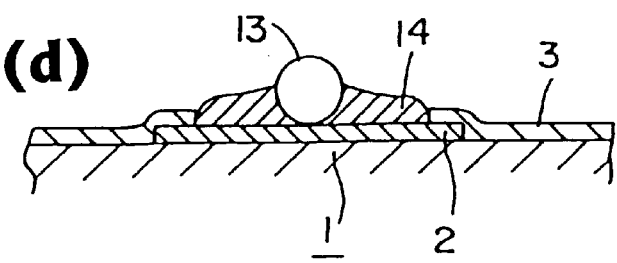

FIG. 8 (a) to FIG. 8(d) show cross sections of the electrodes in the major steps at the first stage of the 4th embodiment.

Figure 9A:
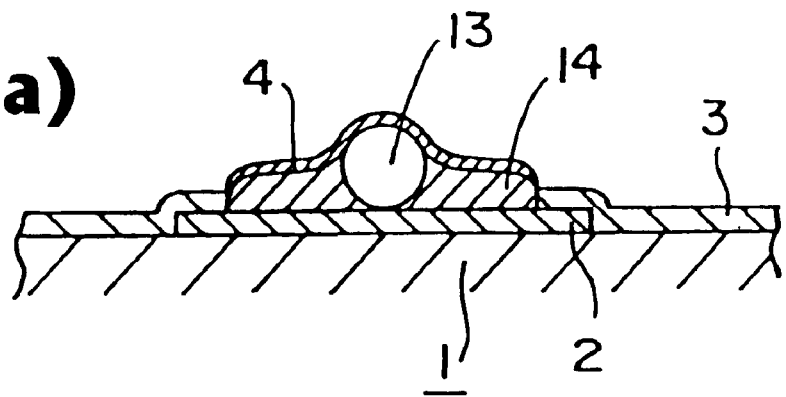
Figure 9B:
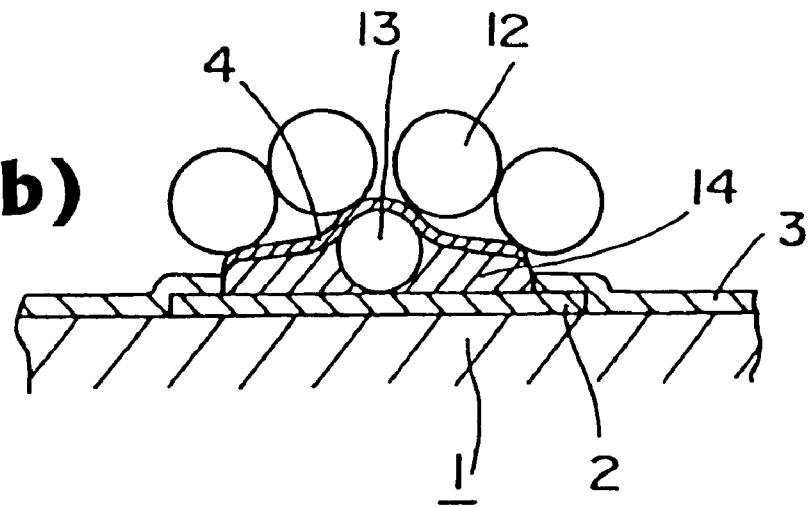
Figure 9C:
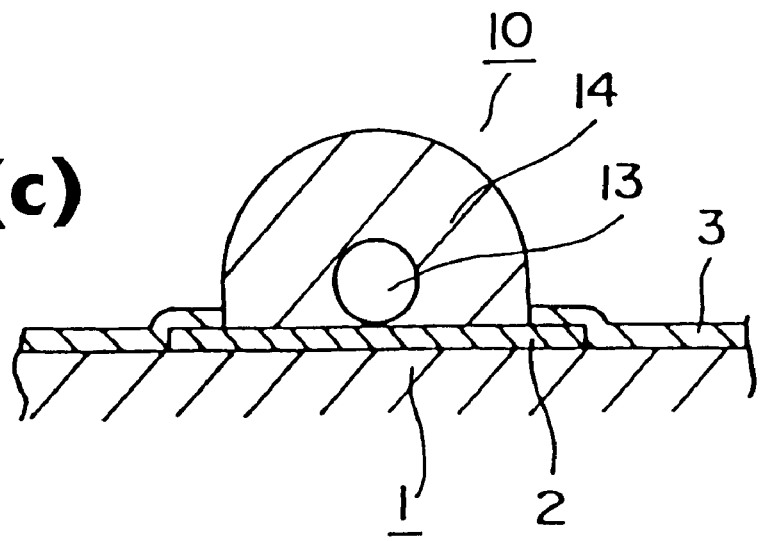

FIG. 9 (a) to FIG. 9(c) similarly show cross sections of the electrodes in the major steps at the second stage of the 4th embodiment.

Figure 10:
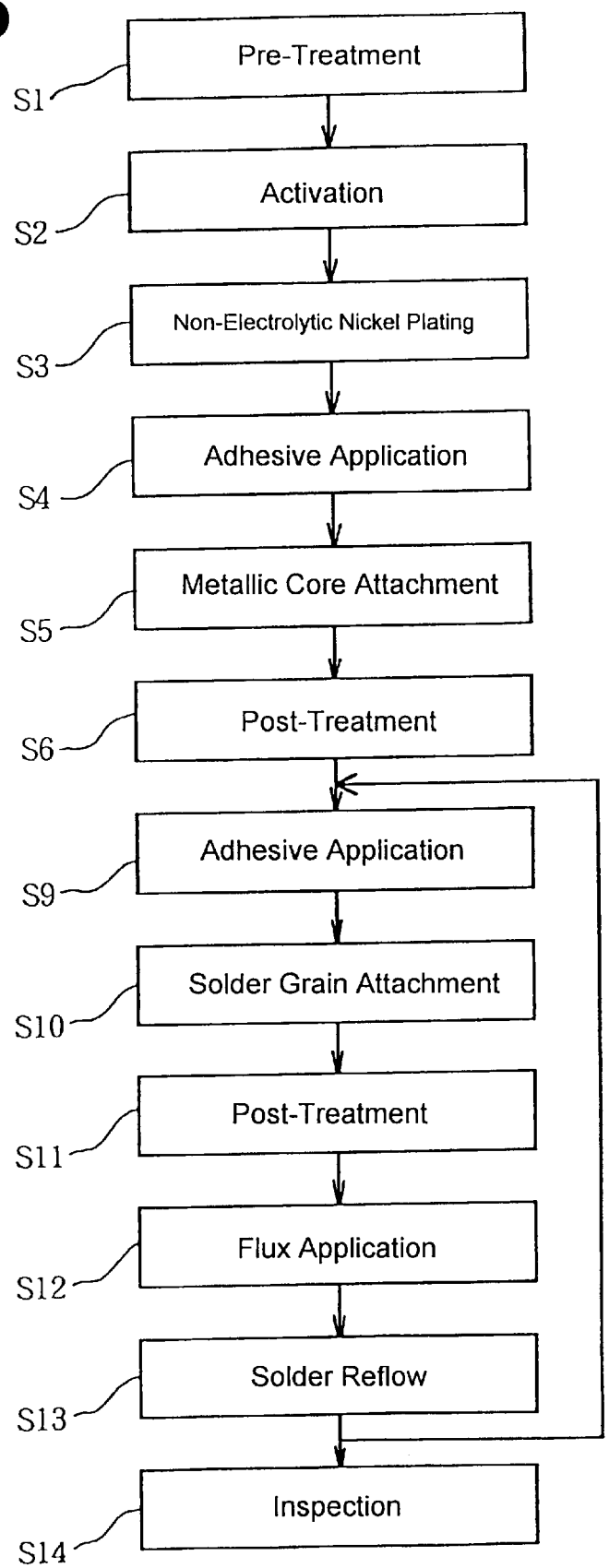

FIG. 10 is a step flow diagram of another embodiment employing metallic core of the method for forming a bump of a semiconductor device in the present invention.

Figure 11:
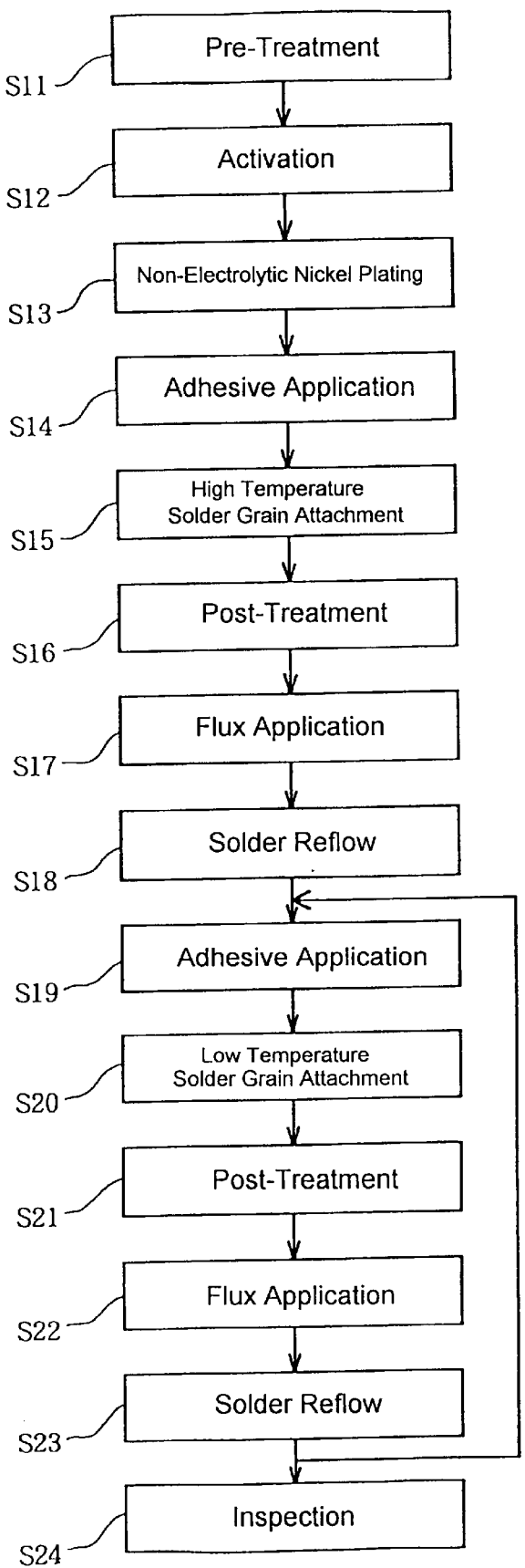

FIG. 11 shows a step flow diagram of a 5th embodiment of the method for forming a bump of a semiconductor device in the present invention.

Figure 12A:
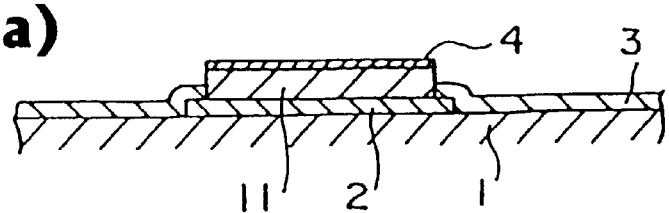
Figure 12B:
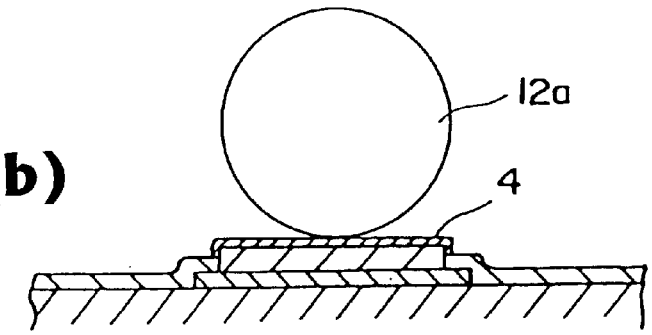
Figure 12C:
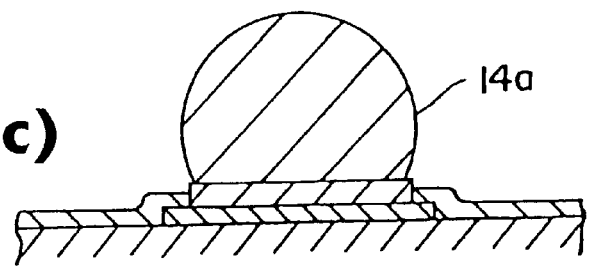
Figure 12D:
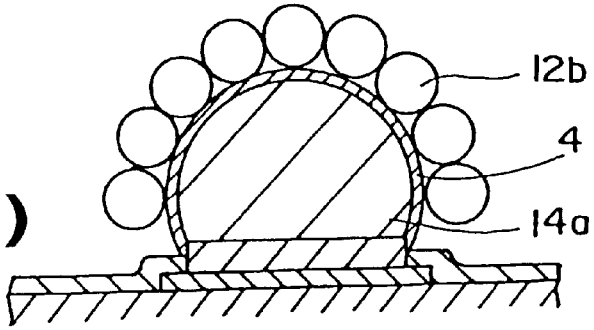
Figure 12E:
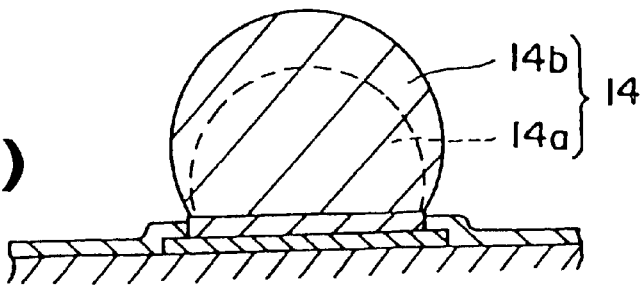

FIG. 12 (a) to FIG. 12(e) show cross sections of electrodes in the major steps in the 5th embodiment as well.

Figure 13:
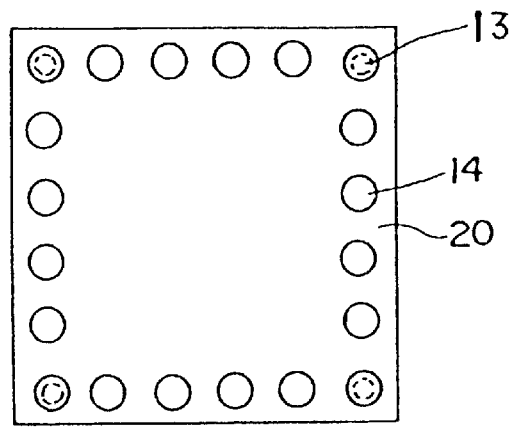

FIG. 13 is a plan diagram of a semiconductor device on which metallic cores are placed within at least three solder bumps by means of the bump formation on semiconductor devices in the present invention.

Figure 14:
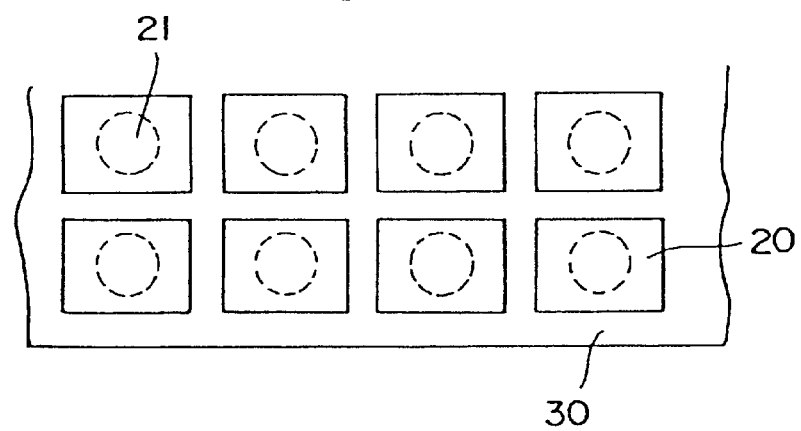

FIG. 14 is a plan diagram that shows the usage condition of semiconductor devices produced with the embodiments of bump formations on semiconductor devices in the present invention.

Figure 15:
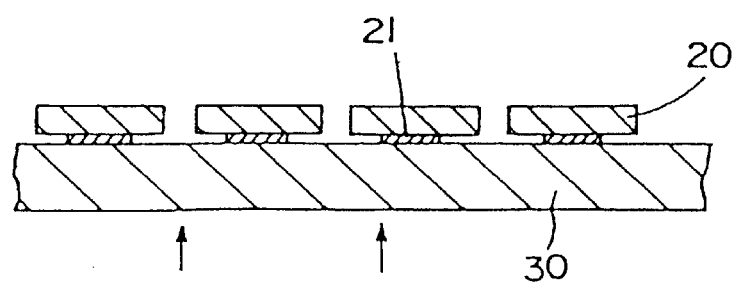

FIG. 15 is a cross sectional diagram that describes the state of sorting semiconductor devices produced with the embodiments of bump formations on semiconductor devices in the present invention onto a tray.

Figure 16:
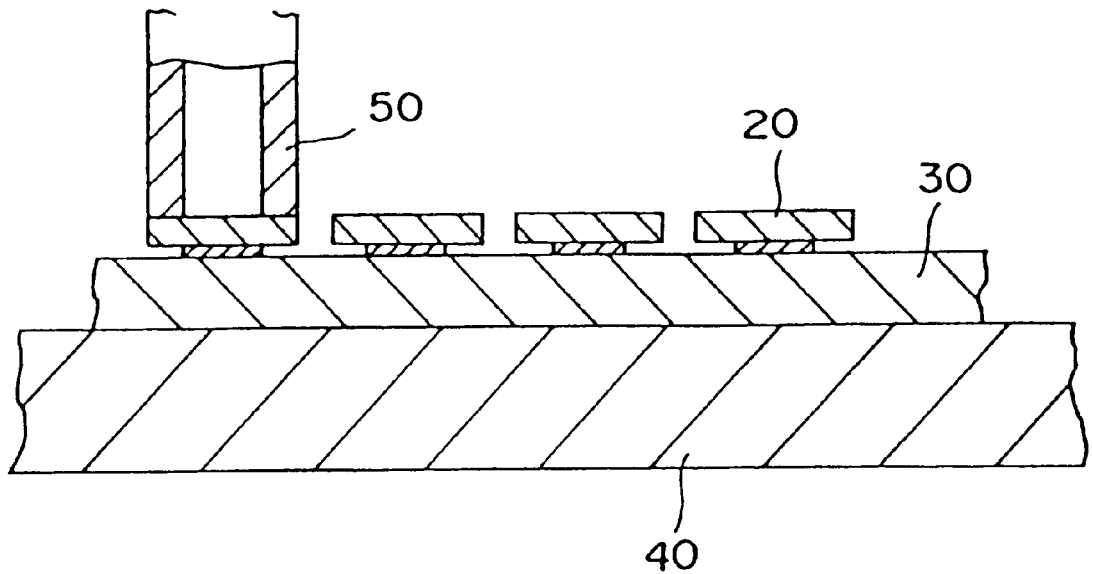

FIG. 16 is a cross sectional diagram that describes the state of sorting semiconductor devices produced with the embodiments of bump formations on semiconductor devices in the present invention onto a tray.

Figure 17:
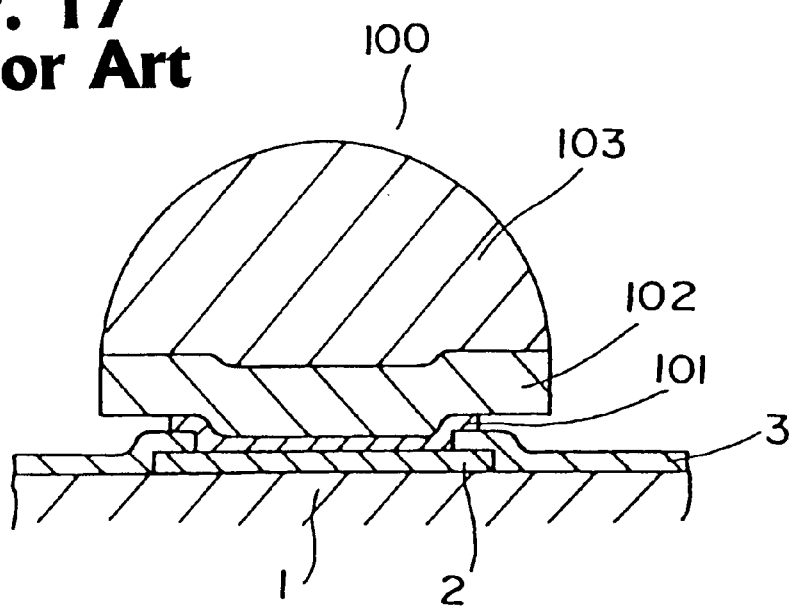

FIG. 17 shows the cross section of a conventional solder bump.

THE BEST FORMS TO IMPLEMENT THE INVENTION

The present invention will now be described with reference to the attached figures and diagrams.

1st Embodiment

First, the 1st embodiment of the present invention is described using FIG. 1 and FIGS. 2(a)–2(f).

Figure 1:
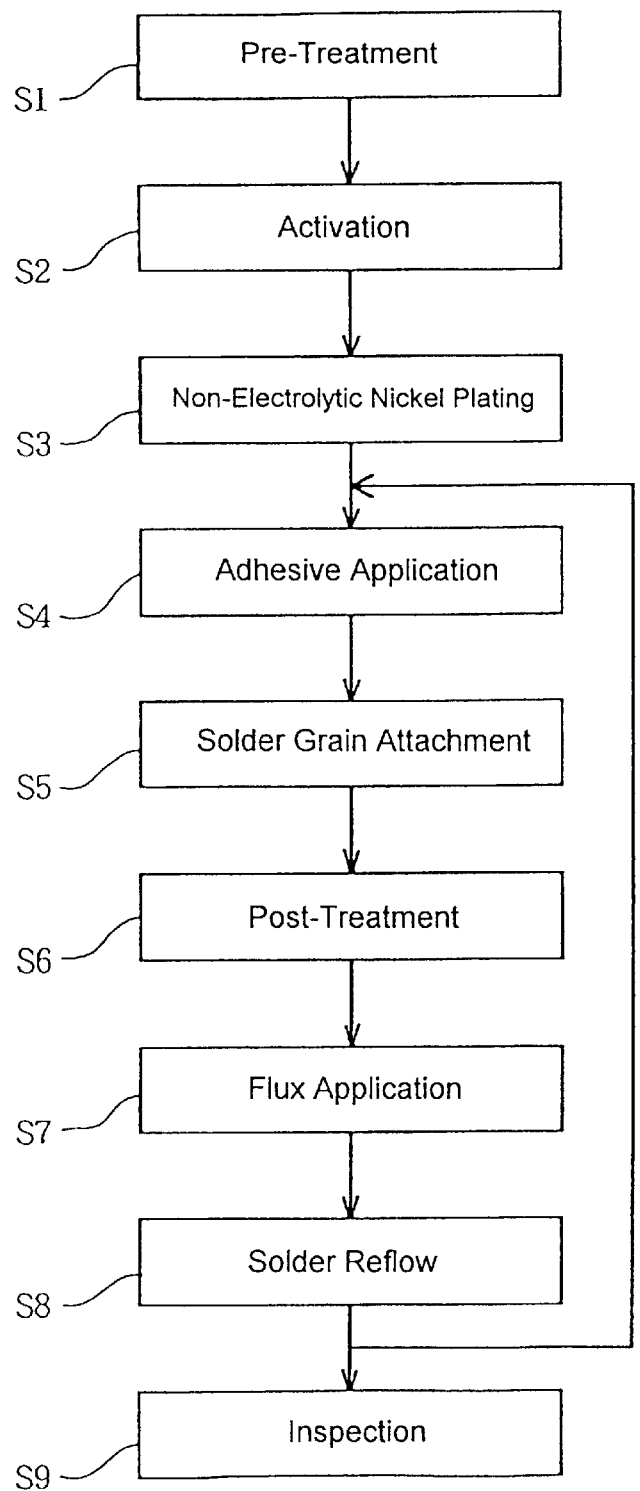
Figure 2A:
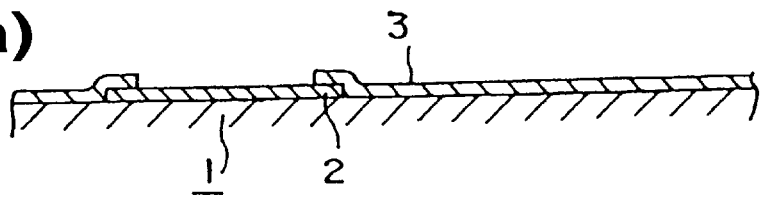
Figure 2B:
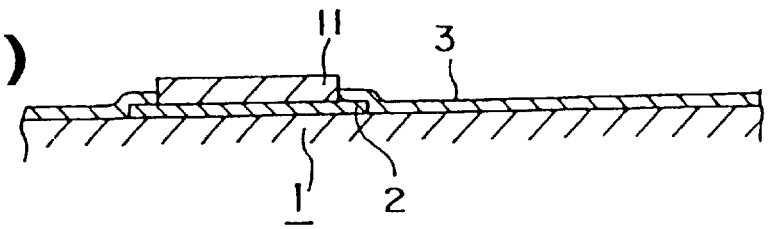
Figure 2C:
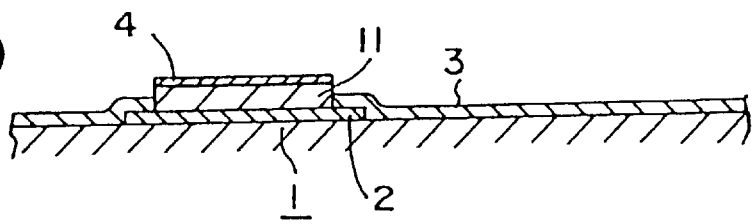
Figure 2D:
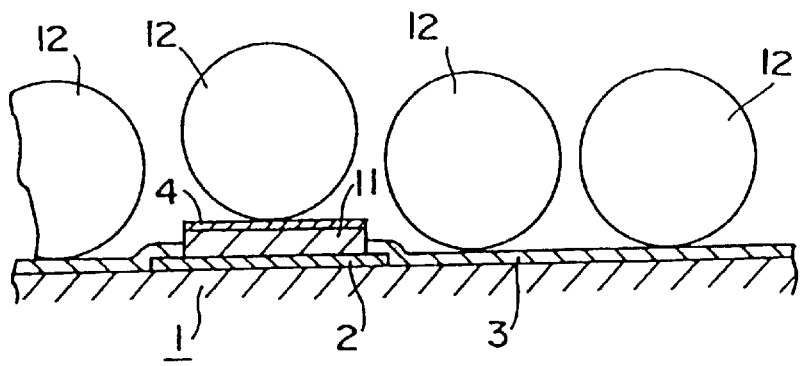
Figure 2E:
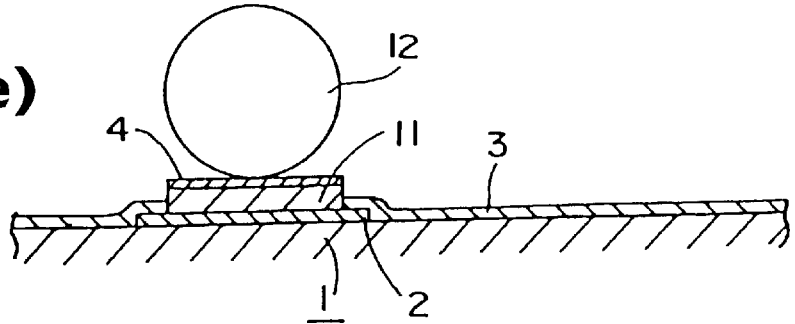
Figure 2F:
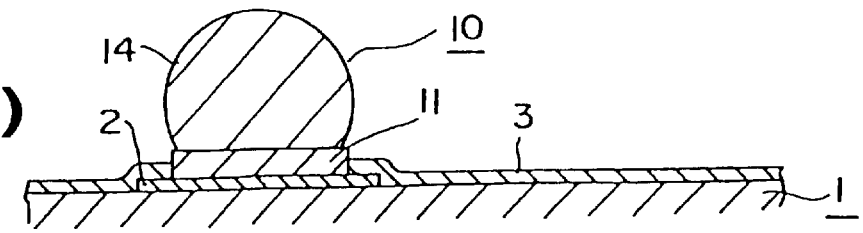

FIG. 1 shows a step flow chart, and FIG. 2 (a) to FIG. 2(f) show cross sections of the electrode portions in the major steps.

In a pre-treatment step S1, in FIG. 1, an oxide film on an aluminum pad electrode of a finished semiconductor device on the wafer 1 is removed as shown in FIG. 2(a).

Then, an activation step S2 is performed to non-electrolytically plate nickel selectively on a pad electrode 2. Further, in a non-electrolytic nickel plating step S3, a nickel film 11 is non-electrolytically plated on the pad electrode 2 as shown in FIG. 2(b). 3 is a passivation film.

Next, in an adhesive applying step S4, the wafer 1 is soaked in a chemical vat and then dried in order to selectively apply an adhesive 4 to the exposed metallic portion, as shown in FIG. 2(c).

In a solder grain attaching step S5, solder grains 12 are then sprinkled onto the wafer 1 as shown in FIG. 2(d). In this implementation, the diameter of the solder grains is approximately 100 μm.

Further, in a post-treatment step S6, solder grains 12, which are present on the portions to which the adhesive 4 is not applied, are removed by moderately brushing after a heat step to tentatively attach a solder grain to the electrode portion, as shown in FIG. 2(e). This step leaves the solder grain 12 only on the portion to which the adhesive is applied.

In this way, after solidifying the solder grain 12 on the metallic portion of the wafer 1, a flux is applied to the surface of the wafer 1 as a flux application step S7. Then, by processing the wafer through a reflow furnace as a solder reflow step S8, molten solder 14 becomes spherical due to the surface tension as shown in FIG. 2(f). Finally, the wafer is inspected in an inspection step S9 after rinsing and drying to complete solder bumps 10 on the wafer.

If the thickness of the solder film is not sufficient after the solder reflow step S8, it is necessary to repeat the adhesive application S4 and other steps thereafter.

In the present embodiment, the diameter of the solder grain is approximately 100 μm, and one solder grain adheres to one electrode. However, it is possible for multiple solder grains with a diameter of 50 μm or less to adhere to one electrode.

2nd Embodiment

A 2nd embodiment of the present invention is described hereafter.

Figure 3:
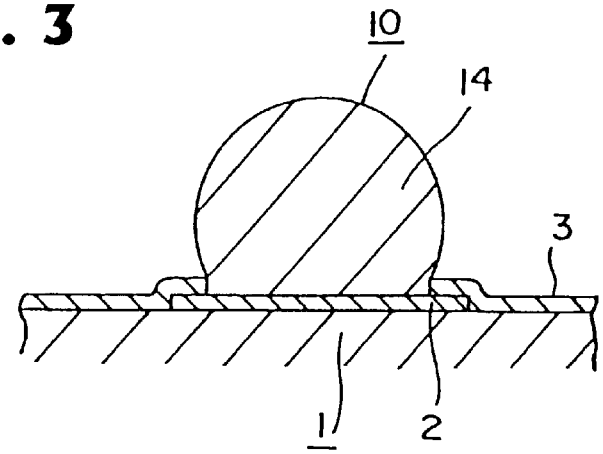

FIG. 3 shows a cross section of a solder bump formed with the 2nd embodiment. The 2nd embodiment of the present invention is the same as the step in FIG. 1 except the activation step S2 and the non-electrolytic nickel plating step S3 have been omitted.

In other words, it requires the pre-treatment step S1, then the adhesive applying step S4 to form an adhesive layer on the pad electrode 2, the solder grain attaching step S5, the post-treatment step S6, the flux application step S7 and the solder reflow step S8 to form the solder bump 10.

This embodiment is applicable to cases in which there are tolerances for diffusion of tin or lead toward the pad electrode metal such as aluminum or for chemical compounds between metals.

The 1st implementation method, which includes the above-mentioned activation S2 and the non-electrolytic nickel plating step S3, and the 2nd implementation method are selectively applicable for each embodiment described hereafter. Therefore, even though a part of the 1st or 2nd embodiment is to be employed, each of the implementations mentioned hereafter is not to be limited to either implementation method.

In addition, non-electrolytic plating is not to be limited to nickel; it is also applicable to gold, silver or chrome plating, for example. Moreover, there can be multiple layers or composite plating of such materials.

3rd Embodiment

Next, a 3rd embodiment of the present invention is described.

Figure 4A:
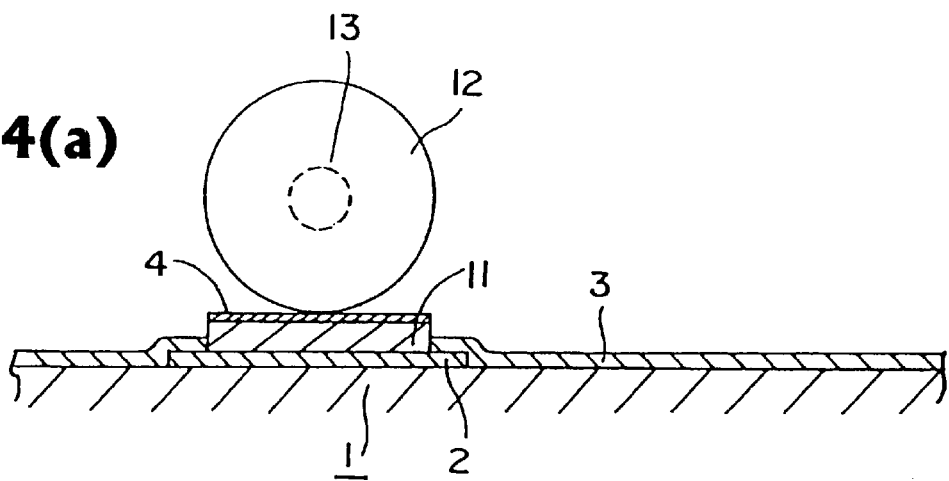
Figure 4B:
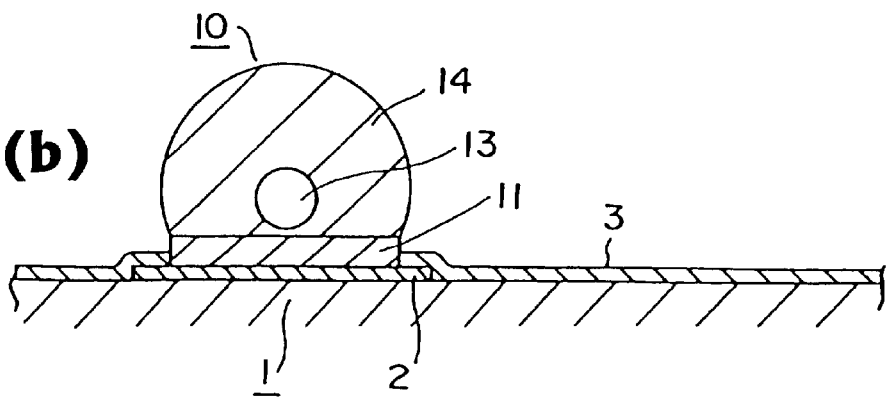

FIGS. 4(a) and 4(b) demonstrates cross sections of the electrode portions in major steps.

This 3rd implementation method is also based on the process shown in FIG. 1 to form bumps. However, a spherical metallic core 13, which is made of copper for example, is placed into a solder grain 12 in this embodiment as shown in FIGS. 4(a) and 4(b).

In this embodiment, the diameter of the metallic core 13 is approximately 20 μm, where the diameter of the solder grain 12 is 100 μm.

In this way, making the diameter of the metallic core 13 smaller than the film thickness of the solder grain 12 (the thickness is approximately 30 μm) allows ascertaining the solder quantity relative to the metallic core 13 sufficiently. This eliminates the need to replenish the solder.

In the process sequence, a solder bump is formed as shown in FIG. 4 (b) in the following sequence: the solder grain 12 containing the metallic core 13 is secured to the metallic portion of the wafer 1 with the adhesive 14; flux is then applied to the surface of the wafer 1 in the flux application step S7; the wafer is processed through a reflow furnace in the solder reflow step S8, whereby a ball 14 of molten solder containing the metallic core 13 is produced, the ball is maintained spherical by surface tension. The solder bump 10 is formed in this manner.

Even though solder grains that contain metallic cores 13 are used, if the solder film thickness is insufficient after the solder reflow step S8, the adhesive applying step S4 and subsequent steps should be repeated. However, it is not necessary to use solder grains 12 that contain metallic core, and the diameter of the solder grains can be determined according to the required solder film thickness.

Figure 5:
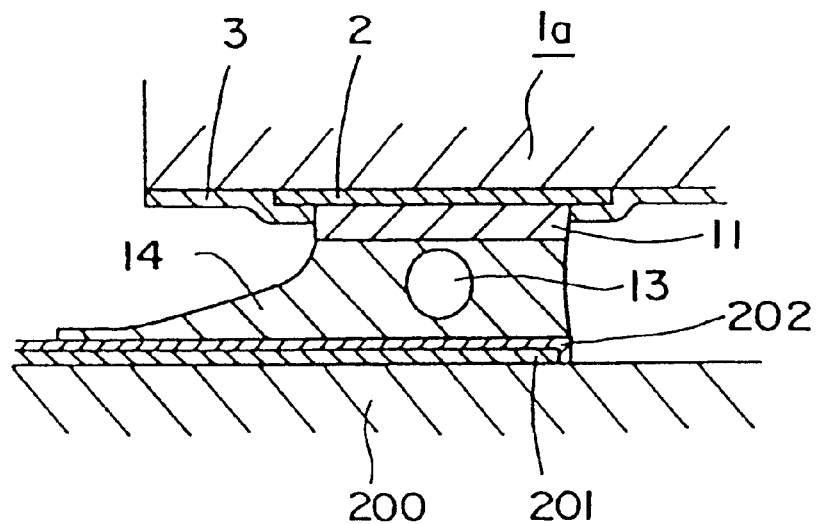
FIG. 5 shows a cross section of the state, where the semiconductor device is bonded on the circuit board with the bump formed by means of the 2nd embodiment.

FIG. 5 shows an example in which a semiconductor device 1a, with a solder bump formed with the 3rd implementation method, is bonded to a gold-plated connection electrode 202 of a circuit substrate 200. The metallic core 13 here functions as a spacer between the semiconductor device 1a and the substrate 200. In addition, since the metallic core 13 is wrapped with solder 14a and does not directly contact the nickel film 11, stress is eased, resulting in a highly reliable connection with easy bonding.

Figure 6:
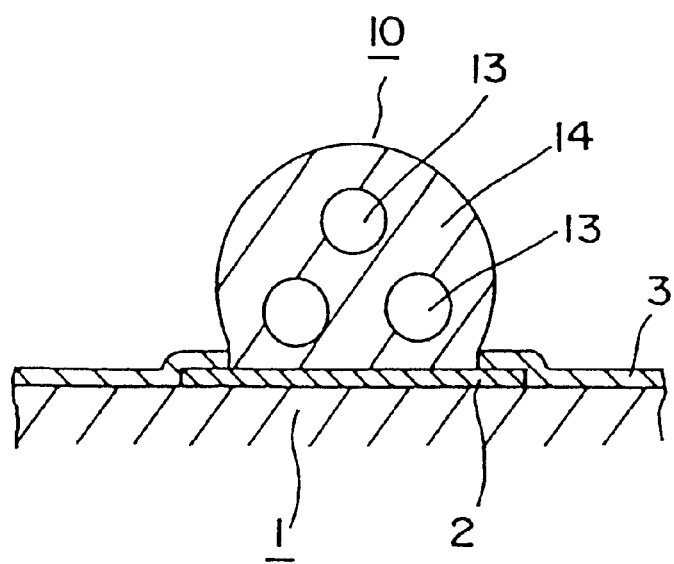
FIG. 6 shows a cross section of the state where three metallic cores are placed within the solder bump by means of the 3rd embodiment.

It is also possible to put multiple metallic cores 13 inside a solder grain 12 to obtain a solder bump 14 such as shown in FIG. 6.

4th Embodiment

Next, a 4th embodiment of the present invention is described.

Figure 7:
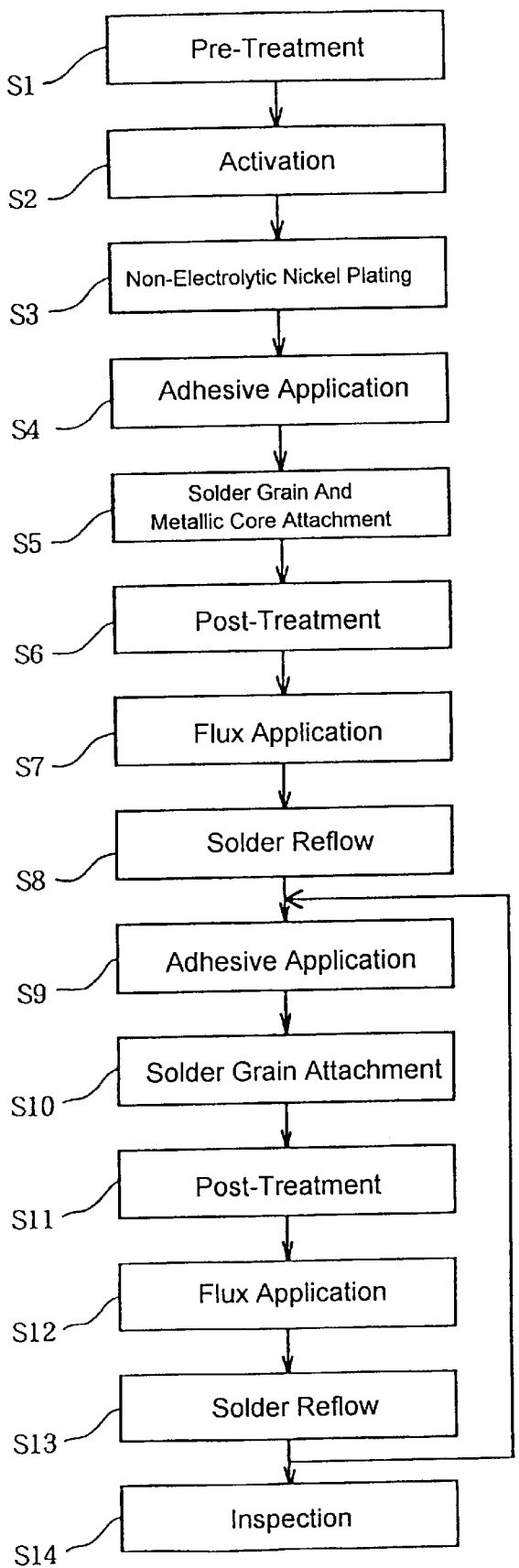
FIG. 7 shows a step flow diagram of a 4th embodiment of the method for forming a bump of a semiconductor device in the present invention.

FIGS. 7, 8 and 9 demonstrate the 4th embodiment of the present invention; FIG. 7 is the step flow diagram of this embodiment; FIG. 8 (a) to FIG. 8(d) are cross sections of electrodes during the major steps at the first stage; and FIG. 9 (a) to FIG. 9(c) are cross sections of electrodes during the major steps at the second stage.

This embodiment method includes: steps at the first stage from S1 to S8, in which solder grains and metallic cores are mixed and caused to adhere to effect the solder-reflow, and steps at the second stage from S9 to S14, in which only solder grains adhere to the adhesive to complete the solder-reflow.

At the first stage, as shown in FIG. 8(a), the adhesive applying step S4 is performed, then the solder grain 12 and the metallic core 13 are mixed and attached to the adhesive 4 in the grain attaching step S5 as shown in FIG. 8(b). In this case, the ratio of the solder grains 12 to the metallic cores 13 depends on the number of bumps per chip unit and should be such that the chip is almost parallel when it is bonded. Then, as shown in FIG. 8(c), after the solder grains 12 and the metallic cores 13 not on pad electrode portions are removed, and the handling step S6 is performed. Next, the flux application step S7 and then the solder reflow step S8 are performed.

Each step at the second stage of this implementation method is performed when the solder film 14 thickness is insufficient relative to the metallic core 13. As shown in FIG. 9(a), the adhesive is applied again to the solder bump that has been formed in the first stage steps in the adhesive applying step S9. Then, the solder grain attaching step S10 and the post-treatment step S11 are performed accordingly so that the solder grains 12 adhere to the pad electrode portion only as shown in FIG. 9(b). Moreover, the flux application step S12 and the solder reflow step S13 are performed to form the solder bump 10 as shown in FIG. 9(c).

Also in this 4th implementation method, the second stage steps are repeated if the amount of solder is insufficient after only one cycle of the second stage steps. Conversely, if the solder bumps 10 are completed after the first stage steps from S1 to S8, each step from S9 to S13 at the second stage can be omitted.

There are various methods for putting the metallic cores 13 into solder bumps 10: a method in which the metallic core 13 is placed in the solder grains 12 in advance; a method in which the solder grains 12 and the metallic core 13 are mixed; a method in which both the above methods are performed together; a method in which the solder grains with and without the metallic core 13 inserted are mixed before being supplied; and a method in which the metallic core 13 and the solder grains 12 are supplied separately.

FIG. 10 is the step diagram of the method in which the metallic core 13 and the solder grains 12 are supplied separately. The step S5 in which the solder grains and the metallic core are caused to adhere is changed to the step in which metallic core only is attached. Accordingly, the flux application step S7 and the solder reflow step S8 are omitted.

5th Embodiment

Next, a 5th embodiment of the present invention is described.

FIG. 11 is the step diagram of this implementation method, and FIGS. 12(a)–12(c) show the cross sections of the electrode portions during the major steps.

In this implementation method, high temperature molten solder forms the inside layer of the solder bumps, and subsequently low temperature molten solder forms the outside layer of the solder bumps.

As previously described in FIG. 1 and FIG. 7, the pre-treatment step S11, the activation step S12, and the non-electrolytic nickel plating step S13 are performed, followed by the adhesive applying step S14, in which the adhesive 4 is applied.

Subsequently, the high temperature solder grain attaching step S15 and the post-treatment step S16 are performed. Then, as shown in FIG. 12(b), the high temperature solder grain 12a adhere only to the portion of the adhesive 4.

Moreover, after the flux application step S17, the solder reflow step S18 is performed to form the inside layer 14a of the solder bump as shown in FIG. 12 (c).

Later, in another adhesive applying step S19, the adhesive 4 is applied to the outside of the bump inner layer 14a made of high temperature molten solder. Further, the low temperature solder grain attaching step S20 and the post-treatment step S21 are performed. As a result, as shown in FIG. 12 (d), the low temperature molten solder 12b adheres only to the outside of the bump inner layer 14a.

Finally, after the flux application step S22, the outer layer portion 14b of the solder bump is molten-formed, with the solder reflow step S23, to complete the entire solder bump 14.

Using the solder bumps formed with this 5th implementation method, the inner layer 14a functions as a metallic core when the semiconductor device is mounted on a circuit board. This is because only the outer layer portion 14b, which is made of low temperature molten solder, is melted to perform the mounting.

Regarding the solder grain material, Pb/Sn=95/5, for example, is used for the high temperature molten material; Pb/Sn=40/60, for example, is used for the low temperature molten material. The ratio of Pb/Sn is not limited to the above. Also, not only Pb/Sn but also Ag/Sn/Zn, Zn/Sn, Sn/Cu, Sn/Ag/Bi, Sn/In, and the like, can be applied as solder material.

6th Embodiment

Next, a 6th embodiment of the present invention is explained.

In this implementation method, when the semiconductor device has three or more pad electrodes, solder bumps which have metallic cores 13 set on at least three pad electrodes or which have the inner layer 14a made of high temperature molten solder are to be formed.

For example, in case of a semiconductor device 20 with a large number of solder bumps 14, as shown in FIG. 13, it is possible to maintain the semiconductor device and circuit board parallel to one another by putting metallic cores in at least three of these solder bumps 14.

It is most desired that the metallic cores 13 be placed in the four solder bumps at each corner of the semiconductor device. In such a case, after the adhesive applying steps, S4 and S14, metallic cores, solder grains with metallic cores, or high temperature molten solder grains are attached to the four corner electrode pad portions, then each step that has previously been mentioned is performed.

Each implementation method mentioned above is applicable to semiconductor devices either as wafers or as chips.

Also, if a semiconductor device 20 that has bumps formed with any implementation method stated above is retained on a palette 30 with an adhesive 21, as shown in FIG. 14, the semiconductor device is often removed from the palette 30 and sorted onto a tray during mounting.

In such a case, it is possible to automate carrying and sorting from the palette 30 to trays (no figure) by using a material, for which the adhesion is lowered by light or heat for adhesive 21. (For example, STRIP MASK #448T made by Asahi Chemical Laboratory is an adhesive for which the adhesion is lowered with heat.)

Specifically, if the adhesive 21 has a characteristic so that the adhesion is lowered with light, as shown in FIG. 15, the palette 30 is made of transparent material, and light is applied from beneath the trays. If the adhesive 21 has a characteristic so that the adhesion is lowered with heat, as shown in FIG. 16, the palette 30 is heated by providing a heater 40 under the palette 30.

In this way, after the strength of the adhesive is lowered, it becomes possible to remove semiconductor devices from the palette 30 with a vacuum chuck 50, as shown in FIG. 16.

Moreover, when semiconductor devices such as chips are mounted on circuit boards, extra bumps that are irrelevant for electric connectivity can be formed by means of each implementation method previously stated. This makes such extra bumps function as spacers, making it possible to mount the semiconductor devices parallel to the circuit boards.

In this case, if a resist film is formed on the circuit board portions corresponding to the extra bumps, the extra bumps are not widened but function without failure as spacers while the semiconductor devices are mounted.

The present invention is not limited to the above-mentioned implementation methods but is applicable by altering any implementation method within the scope of the concept.

INDUSTRIAL APPLICABILITY

The present invention relating to the method for forming a bump of a semiconductor device is applicable to TAB type semiconductor device as well as flip-chip type.

What is claimed is:

1. A method for forming a bump of a semiconductor device comprising:

a plating step of applying non-electrolytic plating on a pad electrode of a semiconductor device, an adhesive applying step of selectively applying an adhesive onto the pad electrode of the semiconductor device by soaking a non-electrolytic plating portion formed in the plating step into a chemical material and drying the chemical material, a solder grain attaching step of adhering at least one solder grain to the portion where the adhesive is applied, and a solder melting step of melting the solder grain to form the bump.

2. The method for forming a bump of a semiconductor device as claimed in claim 1, wherein a metallic core is placed in the bump in the step where the above-mentioned solder grain is melted to form the bump.

3. The method for forming a bump of a semiconductor device as claimed in claim 2, wherein at least one metallic core part of or in all is placed in a part of or in all the solder grain in advance so that the metallic core exists in the bump during the solder melting step.

4. The method for forming a bump of a semiconductor device as claimed in claim 2, wherein the metallic core is mixed with the solder grain and caused to adhere to the portion where the adhesive is applied so that the metallic core exists in the bump during the solder melting step.

5. The method for forming a bump of a semiconductor device as claimed in claim 2, wherein the metallic core is caused to adhere to an electrode portion in an adhesive applying step and a metallic core attaching step which are separate and independent of the solder grain attaching step so that the metallic core exists in the bump during the solder melting step.

6. The method for forming a bump of a semiconductor device of claim 1, wherein the adhesive applying step, the attachment step for the solder grain, and the solder melting step are employed at least once.

7. The method for forming a bump of a semiconductor device as claimed in claim 3, wherein the diameter of the metallic core placed in the solder grain is smaller than a film thickness of the solder grains.

8. The method for forming a bump of a semiconductor device as claimed in claim 1, wherein the adhesive application, solder grain attachment, and solder melting steps comprise first temperature solder adhesive application, first temperature solder grain attachment, and first temperature solder melting steps as well as second temperature solder adhesive application, second temperature solder grain attachment, and second temperature solder melting steps, second temperature being lower than first temperature.

9. The method for forming a bump of a semiconductor device as claimed in claim 8, wherein the first temperature solder adhesive application, first temperature solder grain attachment, and first temperature solder melting steps are performed, and then the second temperature solder adhesive application, second temperature solder grain attachment, and second temperature solder melting steps are performed, and the first temperature solder forms the metallic core.

10. The method for forming a bump of a semiconductor device as claimed in claim 2, wherein when the semiconductor device has three or more pad electrodes, solder bumps in which the metallic cores are put on at least three pad electrodes are formed.

11. The method for forming a bump of a semiconductor device as claimed in claim 10, wherein said at least three pad electrodes have been placed in specific locations in advance.

12. The method for forming a bump of a semiconductor device as claimed in claim 11, wherein said at least three pad electrodes that have been placed in specific locations in advance are placed on four corners of the semiconductor device.

13. The method for forming a bump of a semiconductor device, wherein the bums is formed on the semiconductor device as a wafer by mean as claimed in claim 1.

14. The method for forming a bump of a semiconductor device, wherein the bump is formed on the semiconductor device as a chip by the method as claimed in claim 1.

15. The method for forming a bump of a semiconductor device as claimed in claim 14, wherein the semiconductor device as the chip is retained on a palette by means of an adhesive.

16. The method for forming a bump of a semiconductor device as claimed in claim 15, wherein the semiconductor device as the chip retained on the palette is removed from the palette and placed on a tray.

17. The method for forming a bump of a semiconductor device as claimed in claim 16, wherein the strength of the adhesive is lowered by heat when the semiconductor device as the chip is removed from the palette.

18. The method for forming a bump of a semiconductor device as claimed in claim 16, wherein the strength of the adhesive is lowered by light when the semiconductor device as the chip is removed from the palette.

19. The method for forming a bump of a semiconductor device as claimed in claim 1, wherein said non-electrolytic plating is at least one layer selected from the group consisting of nickel, gold, copper, chromium and a combination thereof.

20. The method for forming a bump of a semiconductor device as claimed in claim 1, wherein the pad electrode is formed of aluminum.

* * * * *